(12) United States Patent
Yokohata et al.

(10) Patent No.: US 10,248,142 B2
(45) Date of Patent: Apr. 2, 2019

(54) COOLING APPARATUS, COOLING METHOD, AND DATA PROCESSING SYSTEM

(71) Applicant: FUJITSU LIMITED, Kawasaki-shi, Kanagawa (JP)

(72) Inventors: Toru Yokohata, Shinagawa (JP); Hiroshi Ishikawa, Musashino (JP)

(73) Assignee: FUJITSU LIMITED, Kawasaki (JP)

( * ) Notice: Subject to any disclaimer, the term of this patent is extended or adjusted under 35 U.S.C. 154(b) by 280 days.

(21) Appl. No.: 15/157,622

(22) Filed: May 18, 2016

(65) Prior Publication Data
US 2016/0353614 A1  Dec. 1, 2016

(30) Foreign Application Priority Data
Jun. 1, 2015  (JP) ................. 2015-111113

(51) Int. Cl.
G05D 23/00 (2006.01)
G05D 23/19 (2006.01)
H05K 7/20 (2006.01)
G05D 7/06 (2006.01)

(52) U.S. Cl.
CPC ....... G05D 23/1917 (2013.01); G05D 7/0676 (2013.01); H05K 7/2079 (2013.01); H05K 7/20836 (2013.01)

(58) Field of Classification Search
CPC ............. G05D 23/1917; G05D 7/0676; H05K 7/2079; H05K 7/20836
See application file for complete search history.

(56) References Cited

U.S. PATENT DOCUMENTS

| | | | | |
|---|---|---|---|---|
| 5,161,739 | A | * | 11/1992 | Saito .......................... F24D 7/00 237/67 |
| 5,904,292 | A | * | 5/1999 | McIntosh ........... G05D 23/1393 165/295 |
| 9,519,297 | B1 | * | 12/2016 | Virskus .............. G05D 23/1927 |
| 2005/0247433 | A1 | * | 11/2005 | Corrado .................... G06F 1/20 165/80.4 |
| 2007/0074863 | A1 | * | 4/2007 | Ichinose .............. G05D 23/192 165/247 |
| 2007/0272155 | A1 | | 11/2007 | Nozawa et al. |

(Continued)

FOREIGN PATENT DOCUMENTS

EP  2354775 A1 * 8/2011 ............. G01K 17/08
JP  60-138382 A  7/1985
(Continued)

OTHER PUBLICATIONS

Japanese Office Action dated Oct. 2, 2018 for corresponding Japanese Patent Application No. 2015-111113, with English Translation, 7 pages.

Primary Examiner — Christopher E. Everett
(74) Attorney, Agent, or Firm — Fujitsu Patent Center

(57) ABSTRACT

A cooling apparatus includes: a pump transports a refrigerant; and a controller controls a discharge amount of the pump depending on a calorific value of a heat generating body. And a cooling method includes: measuring a calorific value of a heat generating body; and controlling a discharge amount of a pump, which transports a refrigerant used for cooling the heat generating body, depending on the calorific value.

10 Claims, 13 Drawing Sheets

(56) References Cited

U.S. PATENT DOCUMENTS

| | | | | |
|---|---|---|---|---|
| 2007/0297136 A1* | 12/2007 | Konshak | ............ | H05K 7/20772 |
| | | | | 361/699 |
| 2009/0086428 A1* | 4/2009 | Campbell | ............ | H05K 7/2079 |
| | | | | 361/694 |
| 2009/0314484 A1* | 12/2009 | Barrett | ................. | G05D 23/192 |
| | | | | 165/293 |
| 2012/0297807 A1* | 11/2012 | Canney | ................ | H05K 7/1497 |
| | | | | 62/228.4 |
| 2013/0220590 A1* | 8/2013 | Lang | ......................... | F24F 3/06 |
| | | | | 165/260 |

FOREIGN PATENT DOCUMENTS

| | | |
|---|---|---|
| JP | 8-63261 A | 3/1996 |
| WO | WO 2004/079805 A1 | 9/2004 |

\* cited by examiner

FIG. 4

| DETERMINATION CONDITION | OPERATING STATE | OPERATING CONDITION OF PUMP 13 | ENERGY SAVING |
|---|---|---|---|
| E≦57.5% | LOW LOAD | 70% | 30% |
| 57.5%<E≦75% | MEDIUM LOAD | 85% | 15% |
| 75%<E | HIGH LOAD | 100% | 0% |

COOLING APPARATUS, COOLING METHOD, AND DATA PROCESSING SYSTEM

CROSS-REFERENCE TO RELATED APPLICATION

This application is based upon and claims the benefit of priority of the prior Japanese Patent Application No. 2015-111113, filed on Jun. 1, 2015, the entire contents of which are incorporated herein by reference.

FIELD

The embodiments discussed herein are related to a cooling apparatus, a cooling method, and a data processing system.

BACKGROUND

A high-performance calculator called a super-computer generates a large amount of heat at it operates. When the temperature of the calculator exceeds a permissible upper-limit temperature, a failure, such as, for example, a malfunction, a trouble, or a reduction in processing capability occurs. Therefore, means for cooling the calculator is required.

In general, a water-cooling type cooling apparatus is adopted to cool a high-performance calculator. In the water-cooling type cooling apparatus, the cooling apparatus and the calculator are connected to each other via a pipe such that heat generated from the calculator is transported to the cooling apparatus by cooling water (refrigerant) to be radiated from the cooling apparatus to the atmosphere.

Since a lot of power is used to cool the high-performance calculator, a reduction in power consumed by the cooling apparatus is requested from the view point of energy saving. In order to reduce the power consumption of the cooling apparatus, it may be considered that the cooling capability of the cooling apparatus is changed depending on the operating state of the calculator, for example.

However, although the amount of heat generated in the calculator is suddenly changed depending on the operating state of the calculator, it is difficult to suddenly change the cooling capability of the cooling apparatus.

Thus, there has been proposed a technology in which a bypass pipe and a flow regulating valve are provided between a pipe of a cooling water outlet side and a pipe of a cooling water inlet side of the cooling apparatus so that an opening degree of the flow regulating valve is regulated depending on the temperature of the cooling water supplied to the calculator. Herein, water or other refrigerants used for cooling the calculator are referred to as the "cooling water," for convenience.

However, the power of the cooling apparatus is not sufficiently saved simply by regulating the opening degree of the flow regulating valve depending on the temperature of the cooling water supplied to the calculator.

The followings are reference documents.
[Document 1] Japanese Laid-Open Patent Publication No. 60-138382, and
[Document 2] International Publication Pamphlet No. WO 2004/079805.

SUMMARY

According to an aspect of the invention, a cooling apparatus includes: a pump transports a refrigerant; and a controller controls a discharge amount of the pump depending on a calorific value of a heat generating body.

The object and advantages of the invention will be realized and attained by means of the elements and combinations particularly pointed out in the claims.

It is to be understood that both the foregoing general description and the following detailed description are exemplary and explanatory and are not restirctive of the invention, as claimed.

BRIEF DESCRIPTION OF DRAWINGS

FIG. 4 is a view illustrating an exemplary table used to determine operating conditions;

DESCRIPTION OF EMBODIMENTS

Hereinafter, preliminary matters will be described in order to enable exemplary embodiments to be easily understood, prior to describing the exemplary embodiments.

Figure 1:
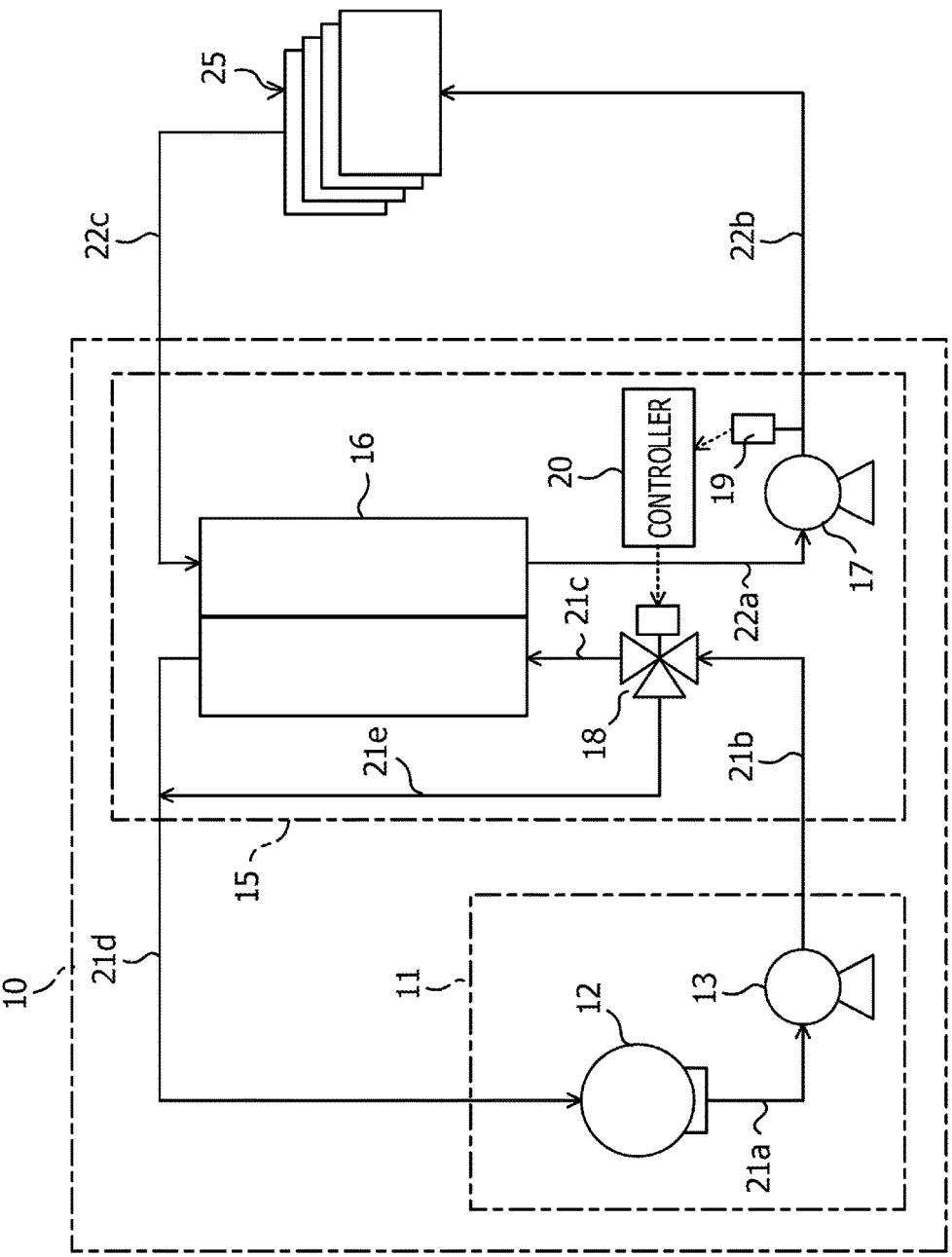
FIG. 1 is a block diagram illustrating an exemplary cooling apparatus and an exemplary data processing system including the cooling apparatus.

FIG. 1 is a block diagram illustrating an exemplary cooling apparatus and an exemplary data processing system including the cooling apparatus.

The cooling apparatus 10 illustrated in FIG. 1 includes a chiller unit 11 and a CDU (Coolant Distribution Unit) 15. The chiller unit 11 includes a refrigerator 12 and a pump 13. Further, the CDU 15 includes a heat exchanger 16, a pump 17, and a three-way valve (flow regulating valve) 18. The heat exchanger 16 includes a first path through which primary cooling water flows and a second path through which secondary cooling water flows, and performs heat exchange between the cooling water flowing through the first path and the cooling water flowing through the second path.

A cooling water outlet of the refrigerator 12 and a suction port of the pump 13 are connected by a pipe 21a, and a delivery port of the pump 13 and a first connecting port of the three-way valve 18 are connected by a pipe 21b. Further, a second connecting port of the three-way valve 18 and a primary cooling water inlet of the heat exchanger 16 are connected by a pipe 21c, and a primary cooling water outlet of the heat exchanger 16 and a cooling water inlet of the refrigerator 12 are connected by a pipe 21d. Furthermore, a third connecting port of the three-way valve 18 and the pipe 21d are connected by a bypass pipe 21e.

A secondary cooling water outlet of the heat exchanger 16 and a suction port of the pump 17 are connected by a pipe 22a, and a delivery port of the pump 17 and a cooling water inlet of a calculator 25 are connected by a pipe 22b. Further, a cooling water outlet of the calculator 25 and a secondary cooling water inlet of the heat exchanger 16 are connected by a pipe 22c.

Further, a temperature sensor 19 configured to detect the temperature of cooling water flowing in the pipe 22b and a controller 20 configured to control the three-way valve 18 depending on the output of the temperature sensor 19 are provided within the CDU 15. The controller 20 controls the three-way valve 18 such that the temperature of the cooling water detected by the temperature sensor 19 becomes, for example, 18° C.±1° C.

In this kind of cooling apparatus 10, the operation state of the chiller unit 11 is set to sufficiently cool the calculator 25 even if the operating rate of the calculator 25 is 100%.

Herein, the cooling water, which comes out from the refrigerator 12 and returns to the refrigerator 12 through the heat exchanger 16 or the bypass pipe 21e, is referred to as the primary cooling water, and the cooling water, which comes out from the heat exchanger 16 and returns to the heat exchanger through the calculator 25, is referred to as the secondary cooling water.

In general, the chiller unit 11 is installed outdoors, and the CDU 15 is installed in the vicinity of the calculator 25 (indoors). Therefore, since the length of the pipe between the chiller unit 11 and the CDU 15 is often 20 m or more, causing pressure loss, a relatively large pump is used as the pump 13. However, under the situation where such a large pump is used and the length of the pipe is long, it is difficult to suddenly change or finely regulate the flow rate of the cooling water fed from the chiller unit 11. Thus, in the cooling apparatus 10 illustrated in FIG. 1, the number of revolutions of the pump 13 is set to be constant and the flow rate of the cooling water flowing into the heat exchanger 16 is changed by the three-way valve (flow regulating valve) 18 so as to cope with a sudden change in the calorific value of the calculator 25.

A heat insulating treatment (e.g., winding an insulation material) is applied to the pipe between the chiller unit 11 and the CDU 15. However, the temperature of the cooling water discharged from the pump 13 rises by about 1° C. to 3° C. until the cooling water reaches the three-way valve 18, due to the effect of environmental temperature. Moreover, the temperature of the cooling water rises by about 1° C. to 3° C. while the cooling water returns to the chiller unit 11 through the bypass pipe 21e.

Thus, the chiller unit 11 unnecessarily consumes power so as to cool the cooling water while the cooling water returns to the chiller unit 11 through the bypass pipe 21e.

When the calculator 25 generates a large calorific value, little (or no) cooling water flows in the bypass pipe 21e so that the waste of power by the cooling water passing through the bypass pipe 21e is negligibly small. However, when the calorific value of the calculator 25 becomes small, the flow rate of the cooling water flowing in the bypass pipe 21e is increased so that the waste of power by the cooling water passing through the bypass pipe 21e becomes large.

First Exemplary Embodiment

Figure 2:
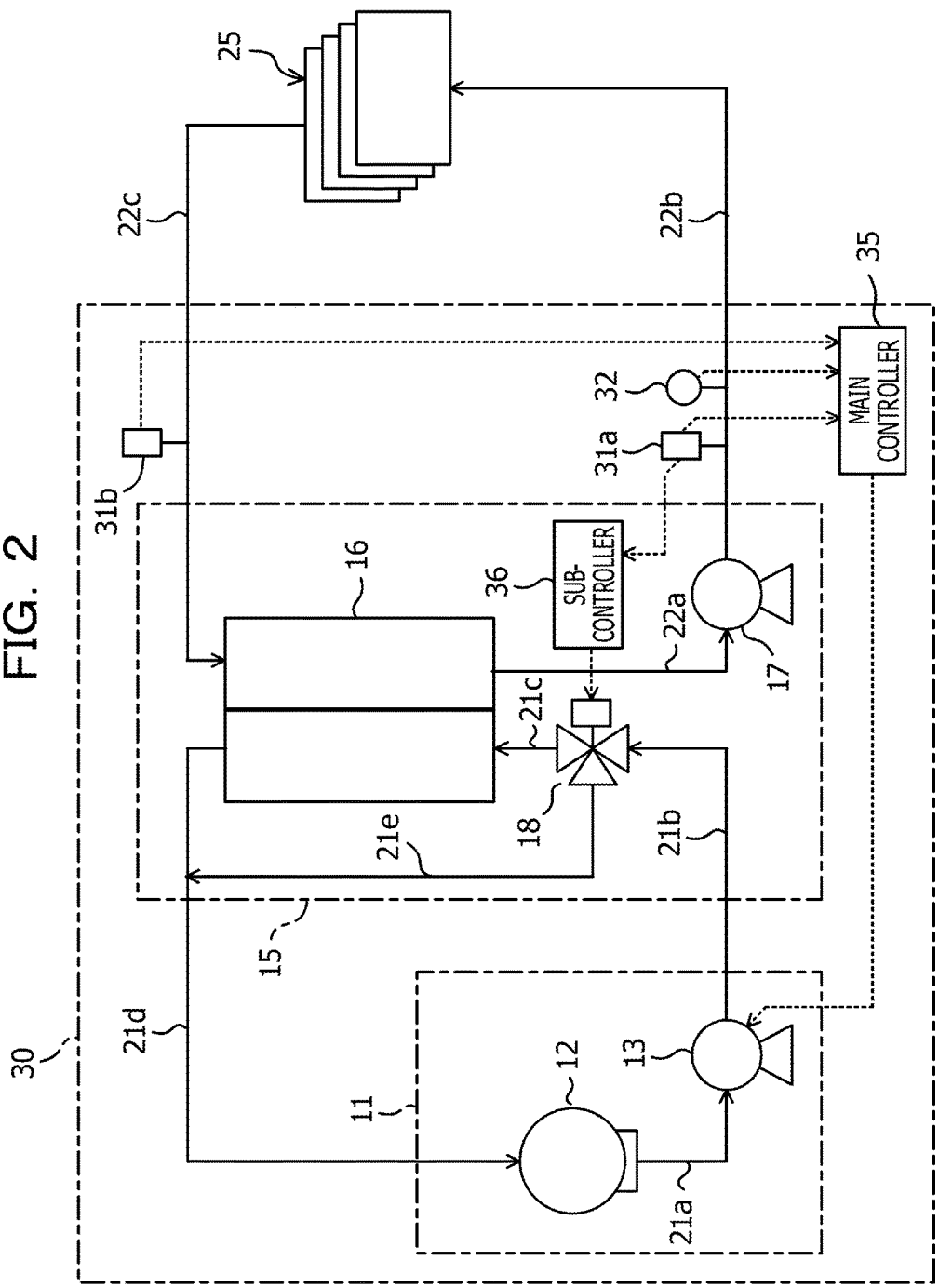
FIG. 2 is a schematic view illustrating a configuration of a cooling apparatus and a data processing system including the cooling apparatus according to a first exemplary embodiment.

FIG. 2 is a schematic view illustrating a configuration of a cooling apparatus and a data processing system including the cooling apparatus according to a first exemplary embodiment. Components common to FIGS. 1 and 2 will be denoted by the same reference numerals.

The cooling apparatus 30 according to the present exemplary embodiment includes a chiller unit 11, a CDU 15, and a main controller 35. The chiller unit 11 includes a refrigerator 12 and a pump 13. Further, the CDU 15 includes a heat exchanger 16, a pump 17, a three-way valve (a flow regulating valve) 18, and a sub-controller 36. Meanwhile, the refrigerator 12 is an exemplary cooling unit.

A cooling water outlet of the refrigerator 12 and a suction port of the pump 13 are connected by a pipe 21a, and a delivery port of the pump 13 and a first connecting port of the three-way valve 18 are connected by a pipe 21b. Further, a second connecting port of the three-way valve 18 and a primary cooling water inlet of the heat exchanger 16 are connected by a pipe 21c, and a primary cooling water outlet of the heat exchanger 16 and a cooling water inlet of the refrigerator 12 are connected by a pipe 21d. Furthermore, a third connecting port of the three-way valve 18 and the pipe 21d are connected by a bypass pipe 21e.

The pipe 21a is an exemplary first pipe, the pipe 21b is an exemplary second pipe, the pipe 21c is an exemplary third pipe, the pipe 21d is an exemplary fourth pipe, and the bypass pipe 21e is an exemplary fifth pipe.

A secondary cooling water outlet of the heat exchanger 16 and a suction port of the pump 17 are connected by a pipe 22a, and a delivery port of the pump 17 and a cooling water inlet of a calculator 25 are connected by a pipe 22b. Further, a cooling water outlet of the calculator 25 and a secondary cooling water inlet of the heat exchanger 16 are connected by a pipe 22c. The pipes 22a and 22b are an exemplary sixth pipe, and the pipe 22c is an exemplary seventh pipe.

A temperature sensor 31a configured to detect the temperature of the cooling water flowing in the pipe 22b and a flow sensor 32 configured to detect the flow rate of the cooling water flowing in the pipe 22b are provided in the pipe 22b. Further, a temperature sensor 31b configured to detect the temperature of the cooling water flowing in the pipe 22c is provided in the pipe 22c. The temperature sensor 31a is an exemplary first sensor, the flow sensor 32 is an exemplary second sensor, and the temperature sensor 31b is an exemplary third sensor.

The outputs of the temperature sensors 31a and 31b and the flow sensor 32 are transmitted to the main controller 35. The main controller 35 controls the number of revolutions of the pump 13, based on the outputs of the temperature sensors 31a and 31b and the flow sensor 32.

Further, the sub-controller 36 disposed in the CDU 15 regulates the opening degree of the three-way valve (a flow regulating valve)18 such that the temperature detected by the temperature sensor 31a becomes a set value (e.g., 18° C.±1° C.), and controls the flow rate of the primary cooling water passing through the bypass pipe 21e. Further, the pump 17 rotates at a constant number of revolutions.

Meanwhile, in the present exemplary embodiment, a high-performance calculator configured to include a network (wiring) that connects a plurality of nodes with each other is assumed as the calculator 25.

Figure 3:
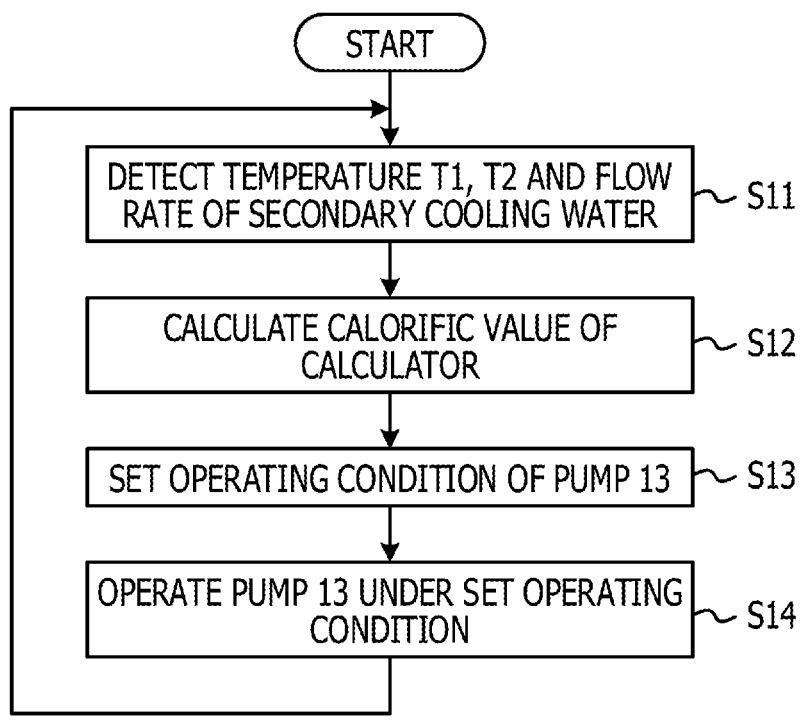
FIG. 3 is a flowchart illustrating an operation of the cooling apparatus according to the first exemplary embodiment.

Hereinafter, an operation of the above-described cooling apparatus 30 will be described with reference to a flowchart of FIG. 3.

First, at step S11, the main controller 35 detects the temperature T1 of the cooling water fed to the calculator 25, the flow rate Q of the cooling water, and the temperature T2 of the cooling water discharged from the calculator 25, based on the outputs of the temperature sensors 31a and 31b and the flow sensor 32.

Subsequently, proceeding to step S12, the main controller 35 calculates an instantaneous calorific value E' of the calculator 25 by the following equation (1).

$$E' = Cp \cdot \rho \cdot Q \cdot \Delta T \quad (1)$$

In this equation, E' is an instantaneous value (kW) of the a calorific value of the calculator 25, Cp is a specific heat (in kJ/kg·K) of the cooling water, ρ is a density (in kg/L) of the cooling water, Q is a flow rate (in L/sec) of the cooling water, and ΔT is a difference K between a measured value T1 of the temperature sensor 31a and a measured value T2 of the temperature sensor 31b.

Subsequently, proceeding to step S13, the main controller 35 calculates a ratio of the instantaneous calorific value E' of the calculator 25 to a maximum calorific value E0 the calculator 25 (E=(E/E0)×100(%)), and sets the operating condition of the pump 13 of the chiller unit 11, based on the value of E.

Meanwhile, the maximum calorific value E0 may be calculated based on the specification of the calculator 25. Further, the operating condition is set using, for example, the table of FIG. 4.

In the case of using the table of FIG. 4, when the value of E is 57.5% or less (E≤57.5%), the main controller 35 determines that the calculator 25 is in a low-load state (a state where the calorific value is low), and sets the operating condition of the pump 13 to 70% of the maximum number of revolutions. Further, when the value of E ranges from 57.5% to 75% (57.5%<E≤75%), the main controller 35 determines that the calculator 25 is in a medium-load state (a state where the calorific value is medium), and then sets the operating condition of the pump 13 to 85% of the maximum number of revolutions. Furthermore, when the value of E exceeds 75% (75%<E), the main controller 35 determines that the calculator 25 is in a high-load state (a state where the calorific value is high), and sets the operating condition of the pump 13 to the maximum number of revolutions (100%).

Subsequently, proceeding to step S14, the main controller 35 operates the pump 13 under a set operating condition. As illustrated in FIG. 4, when the operating condition of the pump 13 is 70%, the power consumption of the pump 13 is reduced by 30%. When the operating condition of the pump 13 is 85%, the power consumption of the pump 13 is reduced by 15%.

After the pump 13 starts operating under the operating condition that is determined at step S14, the main controller 35 returns to step S11 and repeats the above-described steps.

Figure 5:
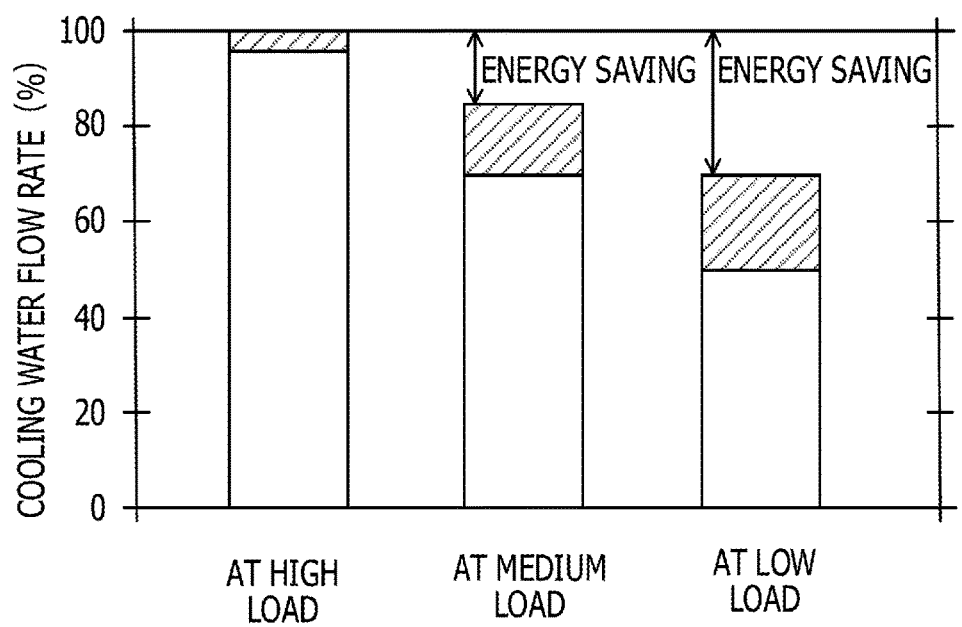
FIG. 5 is a view illustrating an effect of the first exemplary embodiment.

FIG. 5 is a view illustrating an effect of the present exemplary embodiment. Here, when the calorific value of the calculator 25 is maximum (when the operating rate is 100%), the flow rate of the cooling water discharged from the pump 17 is set to 100%. Further, each of the hatched portions of FIG. 5 illustrates the maximum flow rate of the cooling water flowing in the bypass pipe 21e. The flow rate of the cooling water flowing in the bypass pipe 21e is changed depending on the opening degree of the three-way valve 18, and the opening degree of the three-way valve 18 is controlled by the sub-controller 36, based on the output of the temperature sensor 31a, as described above.

In this exemplary embodiment, as described above, the operating condition of the pump 13 of the chiller unit 11 is changed stepwise depending on the calorific value (instantaneous value) generated in the calculator 25, and the opening degree of the three-way valve (flow regulating valve)18 is regulated depending on the temperature of the secondary cooling water. Thus, the power consumed in the chiller unit 11 is reduced compared to that consumed in the cooling apparatus 10 of FIG. 1 while coping with a sudden change in the calorific value of the calculator 25.

Figure 6:
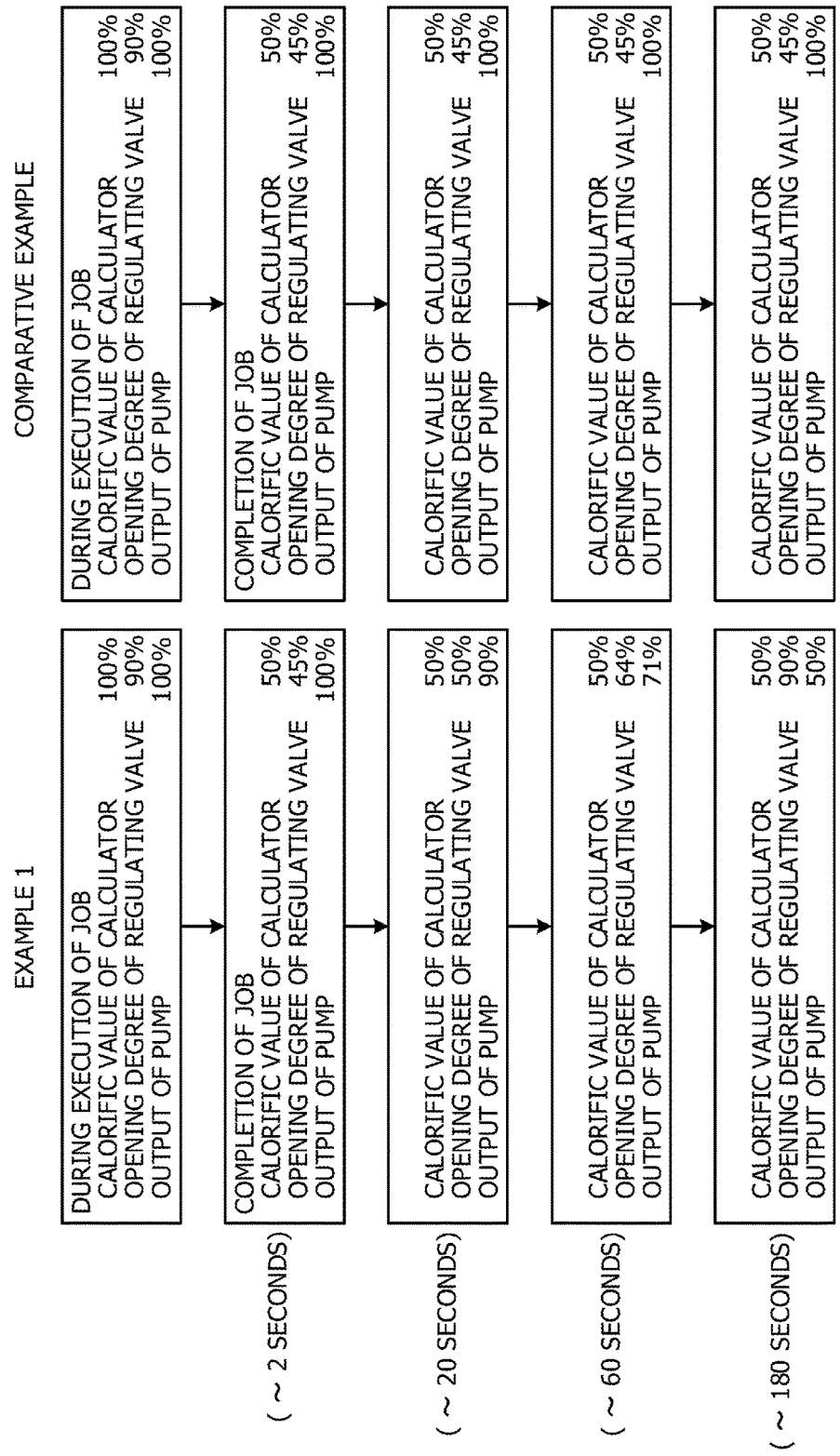
FIG. 6 is a view illustrating exemplary time-dependent changes in a calorific value of a calculator, opening degree of a flow regulating valve, and an output of a pump.

FIG. 6 is a view illustrating exemplary time-dependent changes in the calorific value of the calculator 25, the opening degree of the flow regulating valve (flow regulating valve 18), and the output of the pump 13 (the flow rate of the cooling water that is discharged from the pump 13 (the same shall apply hereafter)).

FIG. 6 illustrates time-dependent changes in the opening degree of the flow regulating valve (three-way valve 18) and the output of the pump 13 when the calorific value of the calculator 25 is reduced from 100% to 50%. Further, Example 1 illustrates time-dependent changes when the cooling apparatus 30 according to the present exemplary embodiment is used, and a comparative example illustrates time-dependent changes when the cooling apparatus 10 of FIG. 1 is used.

Further, in Example 1, it takes about 180 seconds until the output of the pump 13 is stabilized. Meanwhile, a time required to stabilize the output of the pump 13 depends on the length of the pipe as well as the kind of the pump. That is, the longer the length of the pipe is, the longer the time required to stabilize the output of the pump 13 is.

As illustrated in FIG. 6, in the comparative example, even if the calorific value of the calculator 25 is changed, the output of the pump 13 is constant, and the flow rate of the cooling water fed to the heat exchanger 16 is regulated by changing the opening degree of the flow regulating valve (the three-way valve 18).

Meanwhile, in the case of Example 1, even if the calorific value of the calculator 25 is changed, the output of the pump 13 is not immediately changed. In the example illustrated in FIG. 6, after the calorific value of the calculator 25 is changed, the output of the pump 13 is gradually reduced and stabilized after about 180 seconds. Further, the opening degree of the flow regulating valve (the three-way valve 18) is finely changed until the output of the pump 13 is stabilized after the calorific value of the calculator 25 is changed.

As described above, in the comparative example, since the output of the pump 13 is constant, the opening degree of the flow regulating valve (the three-way valve 18) becomes the opening degree depending on the calorific value of the calculator 25. In contrast, according to the present exemplary embodiment, the output of the pump 13 is changed depending on the change in the calorific value of the calculator 25. Further, the opening degree of the flow regulating valve (the three-way valve 18) is finely changed, until the output of the pump 13 is stabilized so that the flow rate of the cooling water fed to the heat exchanger 16 is appropriately regulated.

Meanwhile, in the present exemplary embodiment, the main controller 35 is installed separately from the calculator 25, as illustrated in FIG. 2. However, a dedicated calculator may be disposed in a housing (rack) of the calculator 25 to serve as the main controller 35, or the function of the main controller 35 may be realized using a part of the calculator 25 (a part of processing capability).

Further, according to the present exemplary embodiment, the operating condition of the pump 13 is changed depending on the calorific value of the calculator 25. However, in order to more precisely control the temperature of the cooling water, the operating condition of the refrigerator 12 may be changed together with that of the pump 13.

Moreover, although the cooling of the high-performance calculator has been described in the present exemplary embodiment, the disclosed technology may be applied to the cooling of a server, a storage unit, or other data processing units.

Further, although a heat generating body (the calculator 25) is cooled via the heat exchanger 16 in the present exemplary embodiment, the cooling water may be fed directly from the chiller unit 11 to the heat generating body.

Second Exemplary Embodiment

Figure 7:
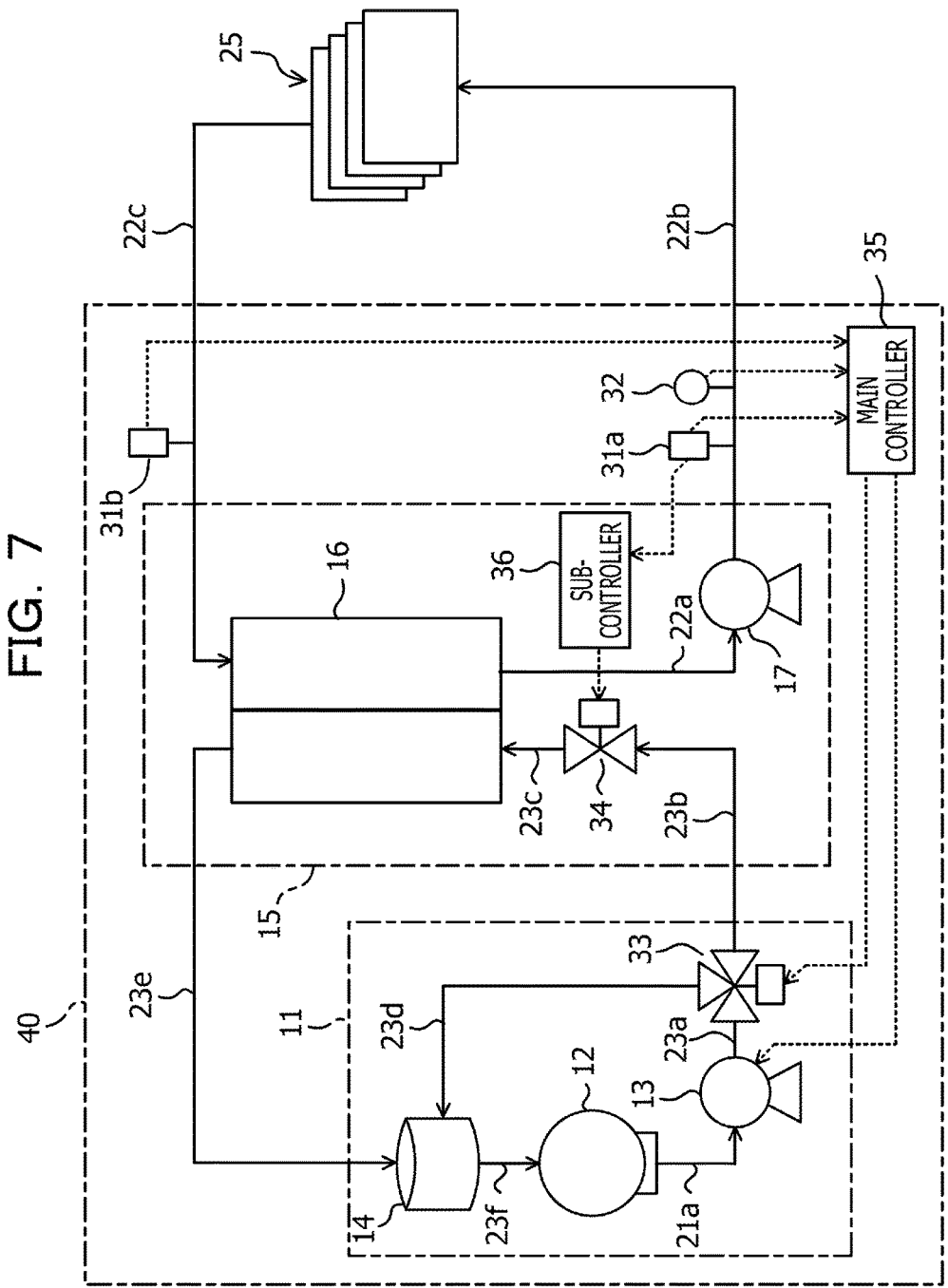
FIG. 7 is a schematic view illustrating a configuration of a cooling apparatus and a data processing system including the cooling apparatus according to a second exemplary embodiment.

FIG. 7 is a schematic view illustrating a configuration of a cooling apparatus and a data processing system including the cooling apparatus according to a second exemplary embodiment. Components common to FIGS. 2 and 7 will denoted by the same reference numerals.

As illustrated in FIG. 7, the cooling apparatus 40 according to the present exemplary embodiment includes a buffer tank 14 and a three-way valve (a bypass valve) 33 that are provided in a housing of a chiller unit 11. Further, a two-way valve (a flow regulating valve) 34 is provided in a CDU 15.

A first connecting port of the three-way valve33 is connected to a discharge port of the pump 13 through a pipe 23a, and a second connecting port is connected the two-way valve33 and a pipe 23c to a primary cooling water inlet of a heat exchanger 16 through a pipe 23b. Further, a third connecting port of the three-way valve 33 is connected to the buffer tank 14 through a bypass pipe 23d. The bypass pipe 23d is also disposed in the housing of the chiller unit 11.

In order to suppress the temperature of the cooling water passing through the bypass pipe 23d from rising, the length of the bypass pipe 23d may be set as short as possible. Further, a heat insulating treatment (e.g., winding an insulation material having a high heat insulating effect) may be applied to the bypass pipe 23d.

The cooling water, which is returned from the heat exchanger 16 through the pipe 23e and the cooling water, which passes through the bypass pipe 23d from the three-way valve33, are introduced into the buffer tank 14. Further, the buffer tank 14 is connected to a water inlet port of the refrigerator 12 through a pipe 23f.

The pipe 21a is an exemplary first pipe, the pipes 23a and 23b are exemplary second pipes, the pipe 23c is an exemplary third pipe, the pipes 23e and 23f are exemplary fourth pipes, and the bypass pipe 23d is an exemplary fifth pipe.

Similarly to the first exemplary embodiment, the main controller 35 controls the number of revolutions of the pump 13 depending on the outputs of the temperature sensors 31a and 31b and the flow sensor 32. Further, the sub-controller 36 controls the two-way valve (a flow regulating valve) 34 such that the temperature detected by the temperature sensor 31a becomes a set value (e.g., 18° C.±1° C.).

Meanwhile, the present exemplary embodiment uses, as the two-way valve (flow regulating valve) 34, a valve having a time constant T3 of a change in opening degree that is shorter than a time constant T2 of a change in opening degree of the three-way valve (bypass valve) 33 (T3<T2). Further, the present exemplary embodiment uses, as the three-way valve 33, a valve having the time constant T2 of the change in opening degree that is shorter than a time constant T1 at the time of changing the output of the pump 13 (T2<T1). The time constant T3 at the time of changing the opening degree of the two-way valve 34 is, for example, a few seconds, the time constant T2 at the time of changing the opening degree of the three-way valve 33 is, for example, tens of seconds, and the time constant T1 at the time of changing the output of the pump 13 is, for example, a few minutes.

When the two-way valve 34 is suddenly closed, there is a case in which a water hammer phenomenon occurs. In order to avoid the water hammer phenomenon, a two-way valve in which a countermeasure against the water hammer phenomenon is taken may be used as the two-way valve 34.

Hereinafter, the operation and effects of the present exemplary embodiment will be described.

As described above, similarly to the first exemplary embodiment, in the present exemplary embodiment, the operating condition of the pump 13 in the chiller unit 11 is changed stepwise depending on the calorific value of the calculator 25 (see, e.g., FIG. 4). In this case, the output of the pump 13 is not instantaneously changed in response to a signal from the main controller 35, but becomes a target output after a certain time (e.g., several minutes) elapses. Meanwhile, the three-way valve 33 reaches a target opening degree within a relatively short time in response to a signal from the main controller 35.

In the case where several minutes are required until the output of the pump 13 is stabilized, in the first exemplary embodiment, an excessive amount of cooling water is transmitted from the pump 13 to the CDU 15 even if the opening degree of the three-way valve 18 is being reduced. Further, the excessive amount of cooling water flows from the three-way valve 18 to the bypass pipe 21e and then returns to the chiller unit 11. Thus, in the first exemplary embodiment, for a few minutes until the output of the pump 13 is stabilized, power is unnecessarily consumed in the chiller unit 11 so as to cool the excessive amount of cooling water.

In order to solve the problem, the present exemplary embodiment uses, as the flow regulating valve, the two-way valve 34 that has a small time constant of the change in opening degree. Further, the three-way valve (a bypass valve) 33 and the bypass pipe 23d are provided in the chiller unit 11, and a valve having a time constant of the change of opening degree than that of the two-way valve 34 is used as the three-way valve 33.

Therefore, even if an excessive amount of cooling water is discharged from the pump 13 for several minutes until the output of the pump 13 is stabilized, the excessive amount of cooling water passes through the bypass pipe 23 in the chiller unit 11 and then enters the buffer tank 14. In this case, since the cooling water merely moves in the chiller unit 11, the temperature hardly rises by the effect of environmental temperature.

Accordingly, the present exemplary embodiment exhibits an effect of further reducing the power consumption of the chiller unit 11 compared with the first exemplary embodiment.

Meanwhile, the present exemplary embodiment provides the buffer tank 14 within the chiller unit 11. Although the buffer tank 14 is not essential, the present exemplary embodiment provides the buffer tank 14 for the following reasons.

That is, there is a case in which the operating condition of the refrigerator 12 may be significantly changed depending on the change of the discharge amount of the pump 13 of the primary cooling water path side so that the temperature of the cooling water fed into the CDU 15 may not be stabilized. However, when the buffer tank 14 is provided at the cooling water inlet side of the refrigerator 12, the change in temperature of the cooling water introduced into the refrigerator 12 is mitigated so that the change in temperature of the cooling water output from the refrigerator 12 becomes small.

Figure 8:
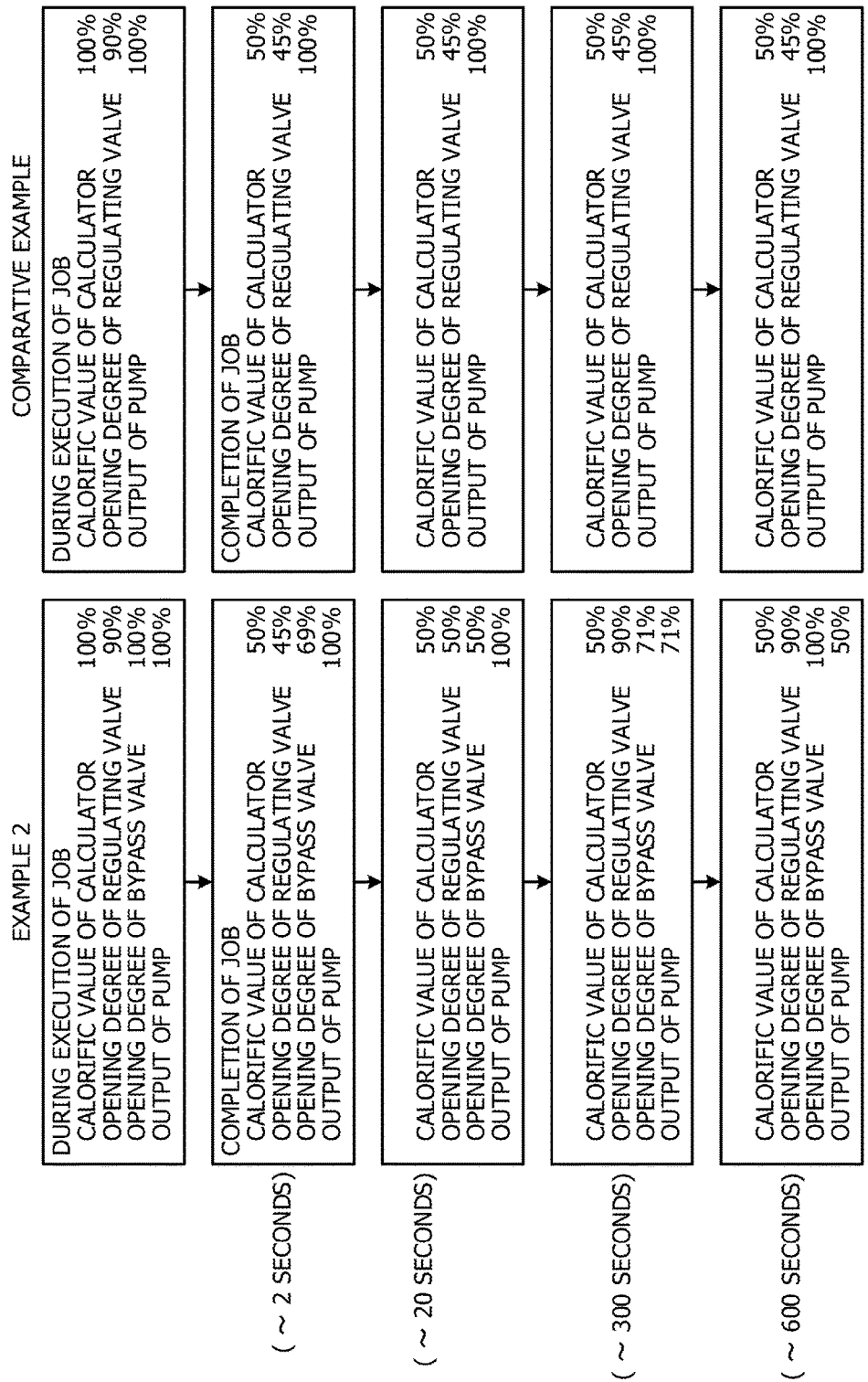
FIG. 8 is a view illustrating exemplary changes in calorific value of a calculator, an opening degree of a flow regulating valve, an opening degree of a bypass valve, and an output a pump.

FIG. 8 is a view illustrating exemplary chronological changes in the calorific value of the calculator 25, the opening degree of the flow regulating valve (the two-way valve 34 or the three-way valve 18), the opening degree of the bypass valve (the three-way valve 33), and the output of the pump 13.

In FIG. 8, Example 2 illustrates a change with the lapse of time when the cooling apparatus 40 according to the present exemplary embodiment is used, while a comparative example illustrates a change with the lapse of time when the cooling apparatus 10 illustrated in FIG. 1 is used. Further, in Example 2, it takes about 600 seconds until the output of the pump 13 is stabilized.

As illustrated in FIG. 8, in the comparative example, even if the calorific value of the calculator 25 is changed, the output of the pump 13 is constant, and the flow rate of the cooling water fed into the heat exchanger 16 is regulated by changing the opening degree of the flow regulating valve (the three-way valve 18).

Meanwhile, in the case of Example 2, even if the calorific value of the calculator 25 is changed, the output of the pump 13 is not immediately changed. In the example illustrated in FIG. 8, after the calorific value of the calculator 25 is changed, the output of the pump 13 is gradually reduced and is stabilized after about 600 seconds. Further, the opening degrees of the bypass valve (the three-way valve 33) and the flow regulating valve (the two-way valve 34) are finely changed until the output of the pump 13 is stabilized after the calorific value of the calculator 25 is changed.

As described above, in the present exemplary embodiment, the output of the pump 13 is changed together with the change in the calorific value of the calculator 25. Further, the flow regulating valve (the two-way valve 34) and the bypass valve (the three-way valve 33) are interlocked with each other depending on the change in the output of the pump 13 so that the flow rate of the cooling water fed to the heat exchanger 16 is properly regulated.

Although the two-way valve 34 is used as the flow regulating valve in the present exemplary embodiment, the three-way valve may be used as the flow regulating valve and the bypass pipe may be provided between the third connecting port of the three-way valve and the pipe on the primary cooling water outlet of the heat exchanger 16, as in the first exemplary embodiment.

Third Exemplary Embodiment

Figure 9:
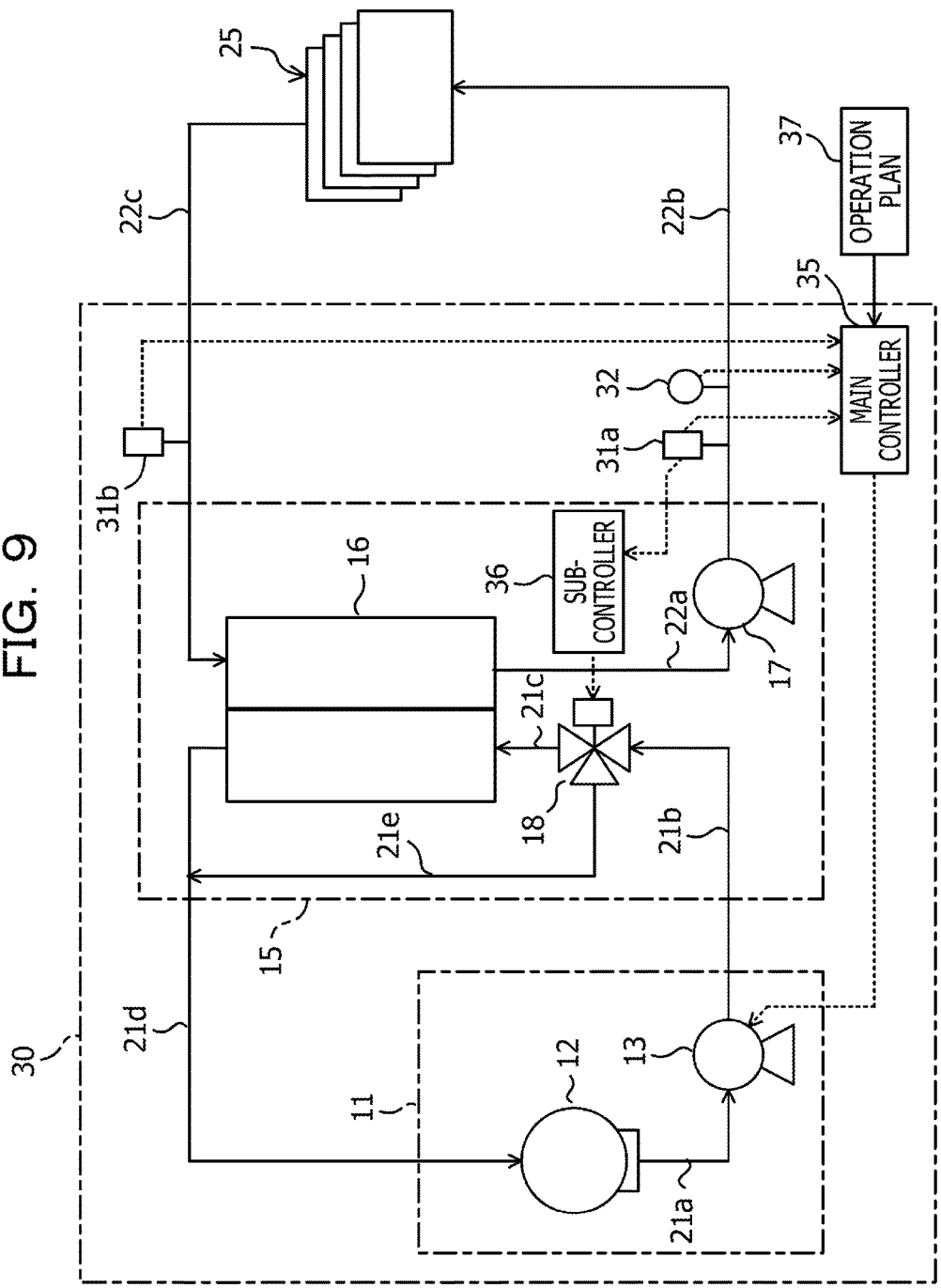
FIG. 9 is a schematic view illustrating a configuration of a cooling apparatus and a data processing system including the cooling apparatus according to a third exemplary embodiment.

FIG. 9 is a schematic view illustrating a configuration of a cooling apparatus and a data processing system including the cooling apparatus according to a third exemplary embodiment.

The present exemplary embodiment is different from the first exemplary embodiment in that the main controller 35 controls the cooling capability of the chiller unit 11 according to an operation plan, and the other configuration of the present exemplary embodiment is basically similar to that of the first exemplary embodiment. Therefore, components common to FIGS. 2 and 9 will be denoted by the same reference numerals, and the detailed descriptions thereof will be omitted.

The high-performance calculator hardly executes one job using all computational resources of the calculator. In general, the high-performance calculator divides the processing capability of the calculator into a plurality of sections and allocates the respective sections to a plurality of users to use the sections for a predetermined period. In this case, a daily operation plan of the high-performance calculator is drafted, and the calculator is operated according to the operation plan.

When the operation plan is determined, the number of nodes (hereinafter, referred to as "the number of operating nodes") required to execute the job input into the calculator may be estimated. Although there is a case in which the number of operating nodes is the same as the number of all the nodes included in the calculator, there is also a case in which the number of operating nodes is smaller than the number of all the nodes included in the calculator.

Thus, in the present exemplary embodiment, the operation plan 37 of one day or a half day is input to the main controller 35. The operation plan 37 includes data on the number of operating nodes per day or half a day.

Figure 10:
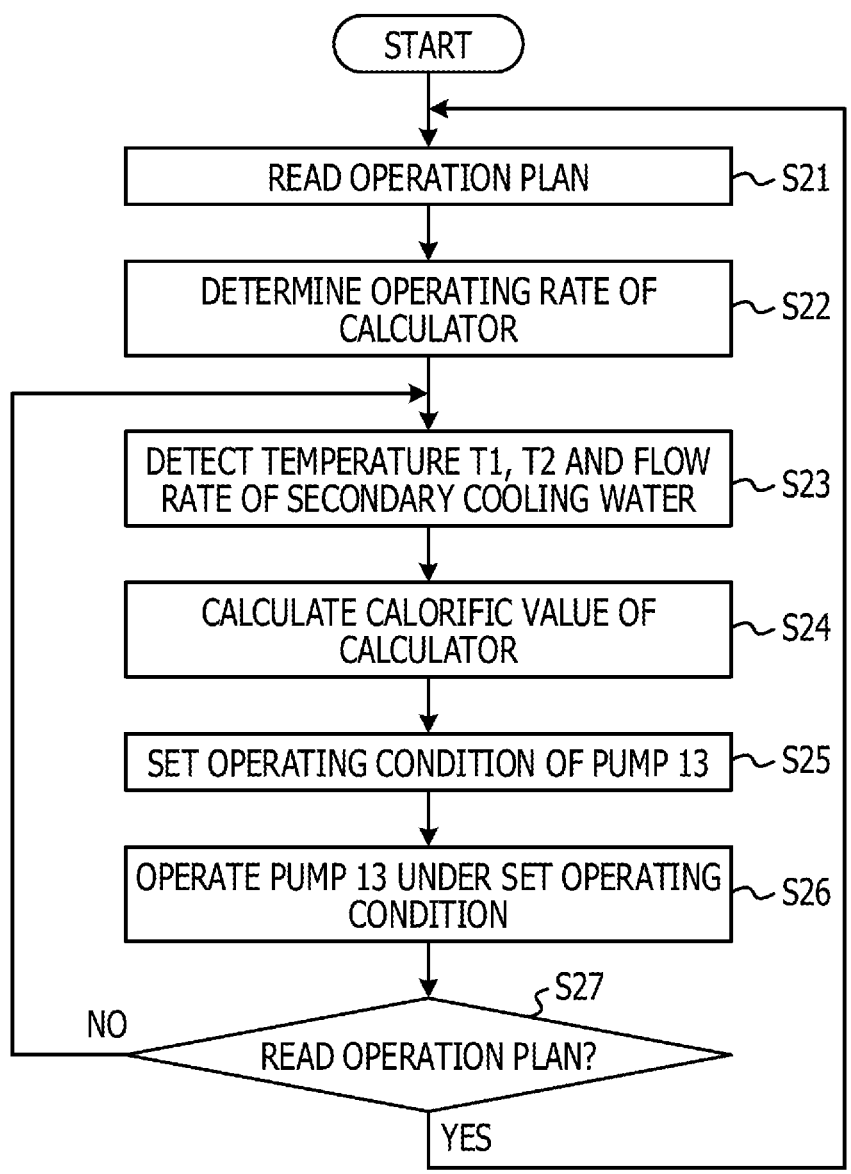
FIG. 10 is a flowchart illustrating an operation of the cooling apparatus according to the third exemplary embodiment.

Hereinafter, the operation of the cooling apparatus 50 according to the exemplary embodiment will be described with reference to the schematic view of FIG. 9 and the flowchart of FIG. 10.

First, at step S21, the operation plan 37 is input to the main controller 35 by an operator. Subsequently, proceeding to step S22, the main controller 35 determines the operating rate of the calculator 25 in a predetermined period (one day or half a day), based on the operation plan 37.

For example, when the number of the operating nodes in a certain period is the same as the number of all the nodes included in the calculator 25, the main controller 35 sets the operating rate of the calculator 25 in this period to 100%. Further, when the number of the operating nodes in a certain period is 75% of all the nodes included in the calculator 25, the main controller 35 sets the operating rate of the calculator 25 in this period to 75%. Furthermore, when the number of the operating nodes in a certain period is 50% of all the nodes included in the calculator 25, the main controller 35 sets the operating rate of the calculator 25 in this period to 50%.

Here, for the convenience of description, it is assumed that, at step S21, the daily operation plan is drafted, and data on the operation plan is input to the main controller 35 by the operator. Further, at step S22, the main controller 35 determines the operating rate of that day (one day).

Subsequently, proceeding to step S23, the main controller 35 detects the temperature T1 of the cooling water fed into the calculator 25, the flow rate Q of the cooling water, and the temperature T2 of the cooling water discharged from the calculator 25, based on the outputs of the temperature sensors 31$a$ and 31$b$ and the flow sensor 32.

Subsequently, proceeding to step S24, the main controller 35 calculates the instantaneous calorific value E' of the calculator 25 using the above-described equation (1).

Subsequently, proceeding to step S25, the main controller 35 calculates a ratio of the instantaneous calorific value E' of the calculator 25 to the maximum calorific value E0 of the calculator 25 (E(=(E'/E0)×100%)) and then sets the operating condition based on the value of the ratio E of the instantaneous calorific value E' to the maximum calorific value E0. However, the maximum calorific value E0 is the calorific value of the calculator 25 when the calculator 25 is operated at the operating rate determined at step S22. Further, the operating condition is set using the table of FIG. 4.

For example, it is assumed that the operating rate of that day determined at step S22 is 100%. In this case, when the value of E is 57.5% or less (E≤57.5%), the main controller 35 sets the operating condition of the pump 13 to 70% (=0.7×1×100). Further, when the value of E ranges from 57.5% to 75% (57.5%<E≤75%), the main controller 35 sets the operating condition of the pump 13 to 85% (=0.85×1× 100). Further, when the value of E exceeds 75% (75%<E), the main controller 35 sets the operating condition of the pump 13 to 100% (=1×1×100).

Further, for example, it is assumed that the operating rate determined at step S22 is 75%. In this case, when the value of E is 57.5% or less (E≤57.5%), the main controller 35 sets the operating condition of the pump 13 to 52.5% (=0.7× 0.75×100). Further, when the value of E ranges from 57.5% to 75% (57.5%≤E≤75%), the main controller 35 sets the operating condition of the pump 13 to 63.8% (=0.85×0.75× 100). Further, when the value of E exceeds 75% (75%<E), the main controller 35 sets the operating condition of the pump 13 to 75% (=1×0.75×100).

Furthermore, for example, it is assumed that the operating rate determined at step S22 is 50%. In this case, when the value of E is 57.5% or less (E≤57.5%), the main controller 35 sets the operating condition of the pump 13 to 35% (=0.7×0.5×100). Further, when the value of E ranges from 57.5% to 75% (57.5%<E≤75%), the main controller 35 sets the operating condition of the pump 13 to 42.5% (=0.85× 0.5×100). Further, when the value of E exceeds 75% (75%<E), the main controller 35 sets the operating condition of the pump 13 to 50% (=1×0.5×100).

Subsequently, proceeding to step S26, the main controller 35 operates the pump 13 under the set operating condition. Thereafter, proceeding to step S27, the main controller 35 determines whether to read the operation plan or not. When the period (one day) set in the operation plan is not yet completed ("NO" at step S27), the above-described steps are repeated starting from step S23. Meanwhile, when it is determined, at step S27, that the period (one day) set in the operation plan has been completed ("YES" at step S27), the main controller 35 returns to step S21 and reads the operation plan for a next period to repeat the above-described steps.

Figure 11:
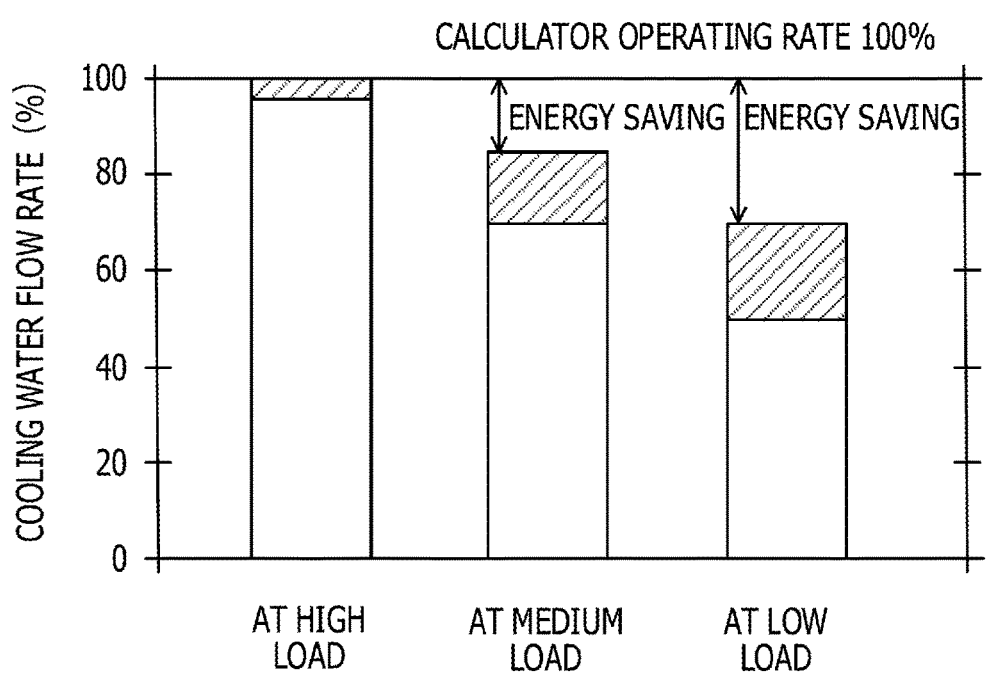
FIG. 11 is a view illustrating an energy saving effect when the operating rate of a calculator is 100%.

FIG. 11 is a view illustrating an energy saving effect when the operating rate of the calculator 25 is 100%. In this case, compared to the cooling apparatus of FIG. 1, the power consumption of the pump 13 is reduced by 15% at the medium load and by 30% at the low load.

Figure 12:
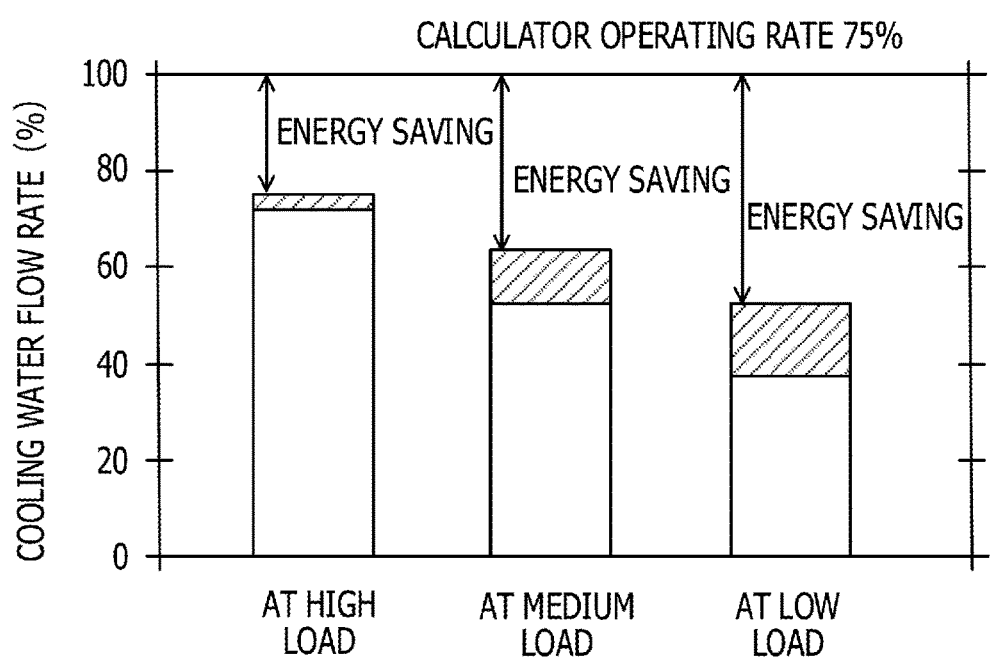
FIG. 12 is a view illustrating an energy saving effect when the operating rate of a calculator is 75%.

FIG. 12 is a view illustrating an energy saving effect when the operating rate of the calculator 25 is 75%. In this case, compared to the cooling apparatus of FIG. 1, the power consumption of the pump 13 is reduced by 25% at the high load, by 36.2% at medium load, and reduced by 47.5% at the low load.

Figure 13:
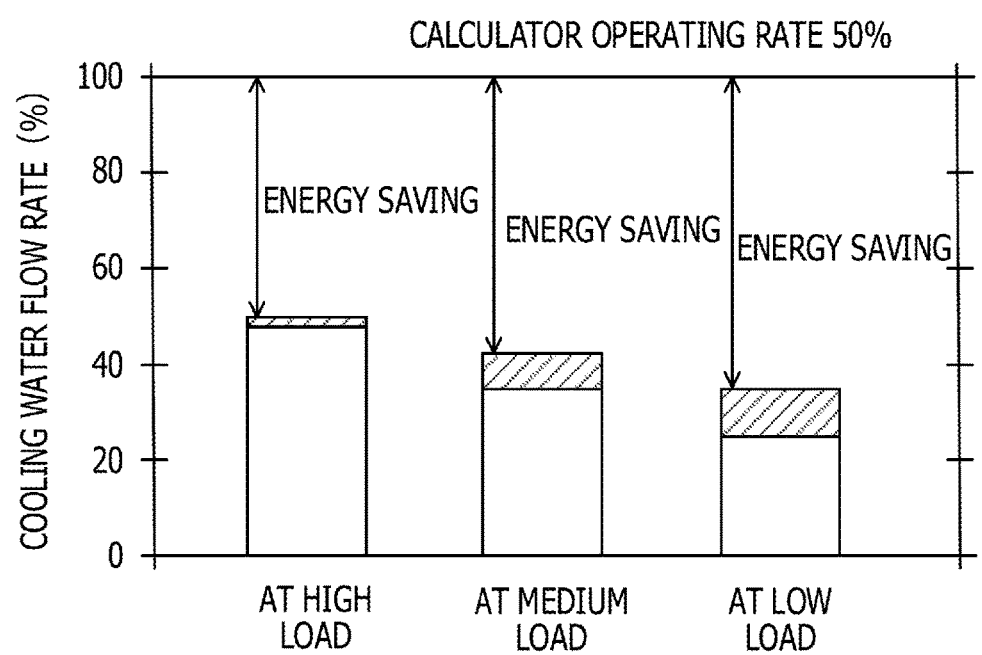
FIG. 13 is a view illustrating an energy saving effect when the operating rate of a calculator is 50%.

FIG. 13 is a view illustrating an energy saving effect when the operating rate of the calculator 25 is 50%. In this case, compared to the cooling apparatus of FIG. 1, the power consumption of the pump 13 is reduced by 50% at the high load, reduced by 57.5% at the medium load, and reduced by 65% at the low load.

As described above, according to the present exemplary embodiment, the maximum operating rate of the calculator 25 is determined for each period according to the operation plan, the maximum calorific value for each period is calculated according to the maximum operating rate of the calculator 25, and the operating condition of the chiller unit 11 (pump 13) is determined according to the result of the calculation. Accordingly, the present exemplary embodiment is capable of further saving energy compared to the first exemplary embodiment. Further, the user of the calculator 25 may send any job to the calculator 25 as long as he or she is within the section allocated to the user, and does not need to consider the operating rate of the CPU.

Although the present exemplary embodiment has been described based on a case where an operation plan is input to the cooling apparatus of the first exemplary embodiment so as to operate a data processing system, the present exemplary embodiment may be configured to input the operation plan to the cooling apparatus of the second exemplary embodiment so as to operate the data processing system.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:
1. A cooling apparatus comprising:
a pump that transports a refrigerant;
a controller that controls a discharge amount of the pump depending on a calorific value of a heat generating body;
a cooler that cools the refrigerant and then feed the refrigerant to a suction side of the pump;
a heat exchanger that includes first and second paths, and performs heat exchange between the refrigerant flowing through the first path and the refrigerant flowing through the second path;
a first pipe that communicates between a refrigerant outlet of the cooler and a suction port of the pump;
a flow regulating valve;
a second pipe that communicates between a delivery port of the pump and an inlet of the flow regulating valve;
a third pipe that communicates between an outlet of the flow regulating valve and an inlet of the first path of the heat exchanger;
a fourth pipe that communicates between an outlet of the first path of the heat exchanger and a refrigerant inlet of the cooler;
a fifth pipe that causes the refrigerant to flow from the second pipe to the fourth pipe, bypassing the heat exchanger, depending on an opening degree of the flow regulating valve;
a sixth pipe that communicates between an outlet of the second path of the heat exchanger and a refrigerant inlet of the heat generating body;
a seventh pipe that communicates between a refrigerant outlet of the heat generating body and an inlet of the second path of the heat exchanger;

a first sensor that detects a temperature of the refrigerant flowing in the sixth pipe;
a second sensor that detects a flow rate of the refrigerant flowing in the sixth pipe; and
a third sensor that detects a temperature of the refrigerant flowing in the seventh pipe,
wherein the controller calculates the calorific value of the heat generating body based on outputs of the first to third sensors.

2. The cooling apparatus of claim 1, wherein the controller acquires the calorific value of the heat generating body from a temperature and a flow rate of the refrigerant fed to the heat generating body and a temperature of the refrigerant discharged from the heat generating body.

3. The cooling apparatus of claim 1, further comprising:
a cooler that cools the refrigerant and then feed the refrigerant to a suction side of the pump;
a bypass path that communicates between a delivery side of the pump and a refrigerant inlet side of the cooler; and
a valve that adjusts a flow rate of the refrigerant that flows in the bypass path depending on a change in discharge amount of the pump.

4. The cooling apparatus of claim 1, wherein the opening degree of the flow regulating valve is changed depending on the temperature of the refrigerant flowing through the sixth pipe.

5. A cooling method comprising:
providing a cooling apparatus including:
a pump that transports a refrigerant;
a controller that controls a discharge amount of the pump depending on a calorific value of a heat generating body;
a cooler that cools the refrigerant and then feed the refrigerant to a suction side of the pump;
a heat exchanger that includes first and second paths, and performs heat exchange between the refrigerant flowing through the first path and the refrigerant flowing through the second path;
a first pipe that communicates between a refrigerant outlet of the cooler and a suction port of the pump;
a flow regulating valve;
a second pipe that communicates between a delivery port of the pump and an inlet of the flow regulating valve;
a third pipe that communicates between an outlet of the flow regulating valve and an inlet of the first path of the heat exchanger;
a fourth pipe that communicates between an outlet of the first path of the heat exchanger and a refrigerant inlet of the cooler;
a fifth pipe that causes the refrigerant to flow from the second pipe to the fourth pipe, bypassing the heat exchanger, depending on an opening degree of the flow regulating valve;
a sixth pipe that communicates between an outlet of the second path of the heat exchanger and a refrigerant inlet of the heat generating body;
a seventh pipe that communicates between a refrigerant outlet of the heat generating body and an inlet of the second path of the heat exchanger;
a first sensor that detects a temperature of the refrigerant flowing in the sixth pipe;
a second sensor that detects a flow rate of the refrigerant flowing in the sixth pipe; and
a third sensor that detects a temperature of the refrigerant flowing in the seventh pipe,
wherein the controller calculates the calorific value of the heat generating body based on outputs of the first to third sensors,
measuring the calorific value of the heat generating body by the controller; and
controlling, by the controller, the discharge amount of the pump, which transports the refrigerant used for cooling the heat generating body, depending on the calorific value of the heat generating body.

6. A data processing system comprising:
a data processor that generates heat as it operates;
a pump that transports a refrigerant used for cooling the data processor;
a controller that controls a discharge amount of the pump, depending on a calorific value of the data processor;
a cooler that cools the refrigerant and then feed the refrigerant to a suction side of the pump;
a heat exchanger that includes first and second paths, and performs heat exchange between the refrigerant flowing through the first path and the refrigerant flowing through the second path;
a first pipe that communicates between a refrigerant outlet of the cooler and a suction port of the pump;
a flow regulating valve;
a second pipe that communicates between a delivery port of the pump and an inlet of the flow regulating valve;
a third pipe that communicates between an outlet of the flow regulating valve and an inlet of the first path of the heat exchanger;
a fourth pipe that communicates between an outlet of the first path of the heat exchanger and a refrigerant inlet of the cooler;
a fifth pipe that causes the refrigerant to flow from the second pipe to the fourth pipe, bypassing the heat exchanger, depending on an opening degree of the flow regulating valve;
a sixth pipe that communicates between an outlet of the second path of the heat exchanger and a refrigerant inlet of the data processor;
a seventh pipe that communicates between a refrigerant outlet of the data processor and an inlet of the second path of the heat exchanger;
a first sensor that detects a temperature of the refrigerant flowing through the sixth pipe;
a second sensor that detects a flow rate of the refrigerant flowing through the sixth pipe; and
a third sensor that detects a temperature of the refrigerant flowing through the seventh pipe,
wherein the controller calculates the calorific value of the data processor, based on outputs of the first to third sensors.

7. The data processing system of claim 6, wherein the controller acquires the calorific value of the data processor, from a temperature and a flow rate of the refrigerant fed to the data processor and a temperature of the refrigerant discharged from the data processor.

8. The data processing system of claim 6, further comprising:
a cooler that cools the refrigerant and then feed the refrigerant to a suction side of the pump;
a bypass path that communicates between a delivery side of the pump and a refrigerant inlet side of the cooler; and
a valve that adjusts the flow rate of the refrigerant flowing through the bypass path, depending on a change in discharge amount of the pump.

9. The data processing system of claim 6, further comprising:
- a bypass valve provided at a pump side of the second pipe to regulate a flow rate of the refrigerant flowing from the second pipe to the fifth pipe, wherein the controller calculates the calorific value of the bypass valve, based on the outputs of the first to third sensors.

10. The data processing system of claim 6, wherein the controller:
- inputs data of an operation plan for each period of the data processor;
- calculates a maximum operating rate for each period of the data processor based on the data of the operation plan; and
- controls the discharge amount of the pump depending on the maximum operating rate for each period and the calorific value of the data processor.

\* \* \* \* \*